(12) United States Patent
Shibata

(10) Patent No.: US 11,616,024 B2
(45) Date of Patent: Mar. 28, 2023

(54) STORAGE DEVICE INCLUDING SEMICONDUCTOR CHIPS SEALED WITH RESIN ON METAL PLATE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Noritoshi Shibata, Hyogo (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 207 days.

(21) Appl. No.: 16/988,532

(22) Filed: Aug. 7, 2020

(65) Prior Publication Data

US 2021/0242133 A1  Aug. 5, 2021

(30) Foreign Application Priority Data

Jan. 31, 2020  (JP) .............................. JP2020-015498

(51) Int. Cl.
| H01L 23/538 | (2006.01) |
| H01L 23/31 | (2006.01) |
| H01L 23/532 | (2006.01) |
| H01L 23/15 | (2006.01) |

(52) U.S. Cl.
CPC .......... *H01L 23/5385* (2013.01); *H01L 23/15* (2013.01); *H01L 23/31* (2013.01); *H01L 23/53214* (2013.01)

(58) Field of Classification Search
CPC ..... H01L 23/498–49894; H01L 23/538–5389; H01L 23/3128; H01L 21/4846–4867; H01L 21/4807–481; H01L 25/04–0756; H01L 23/562–576
See application file for complete search history.

(56) References Cited

U.S. PATENT DOCUMENTS

| 2013/0240909 A1* | 9/2013 | Hiramatsu .......... H01L 23/3121 257/77 |
| 2019/0043827 A1 | 2/2019 | Ito |

FOREIGN PATENT DOCUMENTS

| EP | 1739740 A2 | 1/2007 |
| JP | H0582676 A | 4/1993 |
| JP | H1050897 A | 2/1998 |
| JP | 2000223623 A | 8/2000 |

(Continued)

*Primary Examiner* — Steven B Gauthier
*Assistant Examiner* — Candice Chan
(74) *Attorney, Agent, or Firm* — Kim & Stewart LLP

(57) ABSTRACT

A semiconductor device includes a metal plate; a sidewall member surrounding a periphery of a space above the metal plate; a circuit board provided on the metal plate; a semiconductor chip provided on the circuit board; a first wire connecting the semiconductor chip and an interconnect part of the circuit board; a first resin member covering a bonding portion between the semiconductor chip and the first wire; and a second resin member provided in the space, the second resin member covering an upper surface of the metal plate, the circuit board, the first resin member, and the first wire. A Young's modulus of the first resin member is greater than a Young's modulus of the second resin member. A volume of the second resin member is greater than a volume of the first resin member.

19 Claims, 1 Drawing Sheet

(56) References Cited

FOREIGN PATENT DOCUMENTS

| JP | 2007-012831 A | 1/2007 |
| JP | 2009-070863 A | 4/2009 |
| WO | 2017/145667 A1 | 8/2017 |

\* cited by examiner ered by repeating ON/OFF) which is a reliability test. By using an epoxy resin as the sealing material, stress concentration at a bonding portion between a bonding wire and an Al electrode of a chip can be relaxed, and the power cycle performance (the immunity to detachment of the wire bonded to the Al electrode of the chip) can be improved.

STORAGE DEVICE INCLUDING SEMICONDUCTOR CHIPS SEALED WITH RESIN ON METAL PLATE

CROSS-REFERENCE TO RELATED APPLICATION

This application is based upon and claims the benefit of priority from Japanese Patent Application No. 2020-015498, filed on Jan. 31, 2020; the entire contents of which are incorporated herein by reference.

FIELD

Embodiments described herein relate generally to a semiconductor device.

BACKGROUND

Generally, in a case-type power module, the internal wiring is sealed with a silicone gel to ensure the insulation of the internal wiring; however, the use of an epoxy resin instead of the silicone gel may be considered to improve the performance in a power cycle test (a temperature cycle test in which a current is provided to the module and the chip temperature is repeatedly increased and reduced by repeating ON/OFF) which is a reliability test. By using an epoxy resin as the sealing material, stress concentration at a bonding portion between a bonding wire and an Al electrode of a chip can be relaxed, and the power cycle performance (the immunity to detachment of the wire bonded to the Al electrode of the chip) can be improved.

DETAILED DESCRIPTION

Figure 1:
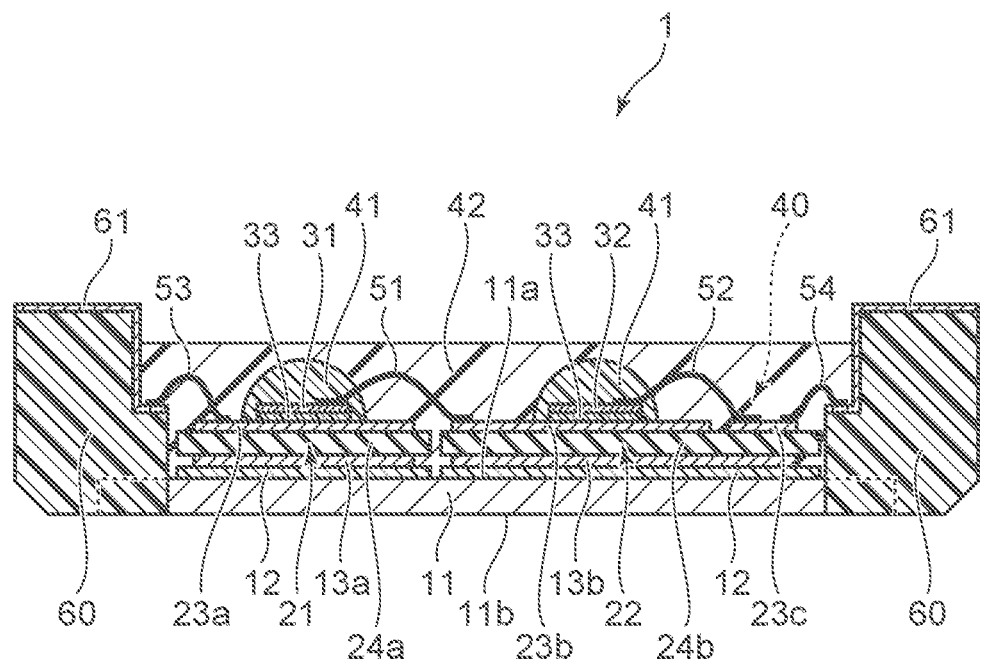
FIG. 1 is a schematic cross-sectional view of a semiconductor device of an embodiment.

According to one embodiment, a semiconductor device includes a metal plate; a sidewall member surrounding a periphery of a space above the metal plate; a circuit board provided on the metal plate, the circuit board including an insulating substrate and an interconnect part; a semiconductor chip provided on the circuit board; a first wire connecting the semiconductor chip and the interconnect part of the circuit board; a first resin member covering a bonding portion between the semiconductor chip and the first wire; and a second resin member provided in the space, the second resin member covering an upper surface of the metal plate, the circuit board, the first resin member, and the first wire. A Young's modulus of the first resin member is greater than a Young's modulus of the second resin member. A volume of the second resin member is greater than a volume of the first resin member.

Embodiments will now be described with reference to the drawings. The same components in the drawings are marked with the same reference numerals.

FIG. 1 is a schematic cross-sectional view of a semiconductor device 1 of an embodiment.

The semiconductor device 1 includes a metal plate 11, a sidewall member 60, circuit boards 21 and 22, semiconductor chips 31 and 32, wires 51, 52, 53, and 54, a first resin member 41, and a second resin member 42.

The sidewall member 60 and the metal plate 11 are included in a case that houses the semiconductor chips 31 and 32. The metal plate 11 is used as the bottom portion of the case. The sidewall member 60 surrounds the periphery of a space 40 above the metal plate 11. For example, the sidewall member 60 is fixed to the metal plate 11 by a bonding agent.

A lower surface 11b of the metal plate 11 is exposed and is not covered with the sidewall member 60. For example, the metal plate 11 is made of copper and functions as a heat dissipation plate. A heat sink may be provided at the lower surface 11b of the metal plate 11. The sidewall member 60 is a resin member made of a resin material.

The circuit boards 21 and 22 are provided on the metal plate 11 inside the space 40 surrounded with the sidewall member 60. The circuit board 21 includes an insulating substrate 24a and an interconnect part 23a. The circuit board 22 includes an insulating substrate 24b and interconnect parts 23b and 23c. The insulating substrates 24a and 24b are, for example, ceramic substrates. For example, the interconnect parts 23a, 23b, and 23c are made of copper.

A conductor part 13a is provided at the lower surface of the insulating substrate 24a, and a conductor part 13b is provided at the lower surface of the insulating substrate 24b. The conductor parts 13a and 13b are bonded to an upper surface 11a of the metal plate 11 by a bonding agent 12. For example, the conductor parts 13a and 13b are made of copper. The bonding agent 12 is, for example, solder.

The interconnect part 23a is provided at the upper surface of the insulating substrate 24a, and the interconnect parts 23b and 23c are provided at the upper surface of the insulating substrate 24b.

The semiconductor chip 31 is provided on the circuit board 21, and the semiconductor chip 32 is provided on the circuit board 22. The semiconductor chips 31 and 32 include, for example, power elements for power control. For example, silicon, silicon carbide, gallium nitride, etc., may be used as semiconductor materials of the semiconductor chips 31 and 32.

The lower surface of the semiconductor chip 31 is bonded to the interconnect part 23a of the circuit board 21 by a bonding agent 33. The lower surface of the semiconductor chip 32 is bonded to the interconnect part 23b of the circuit board 22 by the bonding agent 33. The bonding agent 33 is, for example, solder. Or, the bonding agent 33 may be a sintered material including silver.

The wire 51 electrically connects the semiconductor chip 31 and the interconnect part 23b. For example, an electrode of aluminum is formed at the upper surface of the semiconductor chip 31. One end portion of the wire 51 is bonded to the electrode of the semiconductor chip 31, and the other end portion of the wire 51 is bonded to the interconnect part 23b.

The wire 52 electrically connects the semiconductor chip 32 and the interconnect part 23c. For example, an electrode of aluminum is formed at the upper surface of the semiconductor chip 32. One end portion of the wire 52 is bonded to the electrode of the semiconductor chip 32, and the other end portion of the wire 52 is bonded to the interconnect part 23c.

A conductor part 61 is provided at the upper surface and the inner wall portion of the sidewall member 60. The wire 53 electrically connects the conductor part 61 of the sidewall member 60 and the interconnect part 23a of the circuit board 21. One end portion of the wire 53 is bonded to the conductor part 61, and the other end portion of the wire 53 is bonded to the interconnect part 23a.

The wire 54 electrically connects the conductor part 61 of the sidewall member 60 and the interconnect part 23c of the circuit board 22. One end portion of the wire 54 is bonded to the conductor part 61, and the other end portion of the wire 54 is bonded to the interconnect part 23c.

The wires 51, 52, 53, and 54 are, for example, aluminum wires.

The bonding portion between the semiconductor chip 31 and the wire 51 is covered with the first resin member 41. The first resin member 41 entirely covers the semiconductor chip 31. The bonding portion between the semiconductor chip 32 and the wire 52 is covered with the first resin member 41. The first resin member 41 entirely covers the semiconductor chip 32.

The second resin member 42 is provided in the space 40 surrounded with the sidewall member 60 above the metal plate 11. The second resin member 42 covers the upper surface 11a of the metal plate 11, the circuit boards 21 and 22, the first resin member 41, and the wires 51, 52, 53, and 54. The second resin member 42 covers the semiconductor chips 31 and 32 via the first resin member 41.

The wire bonding portions other than the bonding portions between the semiconductor chips 31 and 32 and the wires 51 and 52 are covered with the second resin member 42 but are not covered with the first resin member 41. In other words, the bonding portion between the wire 51 and the interconnect part 23b, the bonding portion between the wire 52 and the interconnect part 23c, the bonding portion between the wire 53 and the interconnect part 23a, the bonding portion between the wire 53 and the conductor part 61, the bonding portion between the wire 54 and the interconnect part 23c, and the bonding portion between the wire 54 and the conductor part 61 are covered with the second resin member 42 but are not covered with the first resin member 41.

The volume of the second resin member 42 is greater than the volume of the first resin member 41 inside the space 40. The Young's modulus of the first resin member 41 is greater than the Young's modulus of the second resin member 42. The volumetric expansion coefficient difference between the second resin member 42 and the metal plate 11 is greater than the volumetric expansion coefficient difference between the first resin member 41 and the metal plate 11. The volumetric expansion coefficient difference between the second resin member 42 and the insulating substrates 24a and 24b is greater than the volumetric expansion coefficient difference between the first resin member 41 and the insulating substrates 24a and 24b.

The first resin member 41 and the second resin member 42 are insulating resin members. For example, the first resin member 41 includes mainly an epoxy resin, a phenol resin, or an acrylic resin. The second resin member 42 includes mainly a silicone resin or a urethane resin. In the example, the first resin member 41 is an epoxy resin, and the second resin member 42 is a silicone resin.

Figure 2:
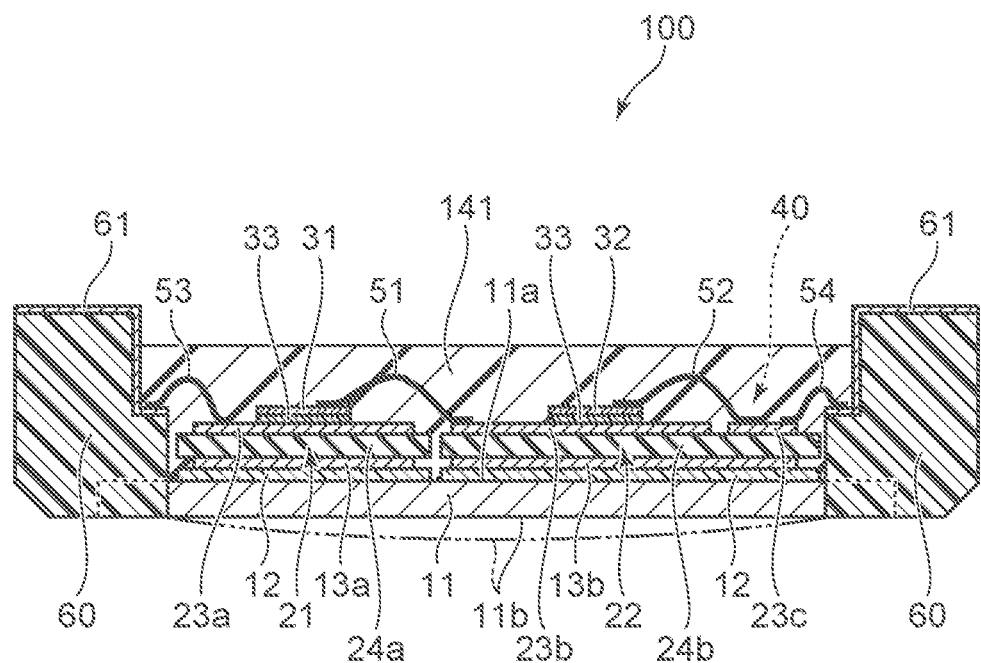
FIG. 2 is a schematic cross-sectional view of a semiconductor device of a comparative example.

FIG. 2 is a schematic cross-sectional view of a semiconductor device 100 of a comparative example.

In the semiconductor device 100 of the comparative example, the space 40 on the metal plate 11 is sealed with only an epoxy resin 141 (corresponding to the first resin member 41 of the embodiment). In a TCT (Temperature Cycling Test) for the structure of such a comparative example, cracks occurred in the epoxy resin 141, and discrepancies occurred because the breakdown voltage of the module could not be maintained. This was due to the volumetric expansion coefficient difference between the epoxy resin 141 and the members included in the module. Furthermore, warp that exceeded the specification occurred in the metal plate 11 due to the volumetric expansion coefficient difference between the epoxy resin 141 and the insulating substrates 24a and 24b and the volumetric expansion coefficient difference between the epoxy resin 141 and the metal plate 11. The warp that occurred in the lower surface 11b of the metal plate 11 is schematically illustrated by a double dot-dash line in FIG. 2.

Among the components included in the semiconductor device 1, the semiconductor chips 31 and 32 generate heat and reach the highest temperatures; therefore, the power cycle performance degrades particularly easily at the bonding portions between the wires 51 and 52 and the semiconductor chips 31 and 32.

In the embodiment, by covering the bonding portions between the wires 51 and 52 and the semiconductor chips 31 and 32 with the first resin member 41 that has a higher Young's modulus, i.e., is harder, than the second resin member 42, the stress concentration at the bonding portions between the wires 51 and 52 and the semiconductor chips 31 and 32 can be relaxed, and the detachment of the wires 51 and 52 can be prevented.

The other portions for which the breakdown voltage is important are sealed with the second resin member 42 that has a lower Young's modulus, i.e., is softer, than the first resin member 41. The warp of the metal plate 11 can be suppressed to be within the specification by sealing the greater part of the space 40 inside the case with the second resin member 42 and by reducing the volume of the first resin member 41 by partially limiting the use of the first resin member 41 which has smaller volumetric expansion coefficient differences with the metal plate 11 and the insulating substrates 24a and 24b than the second resin member 42.

It is sufficient for the first resin member 41 to cover at least the bonding portions between the wires 51 and 52 and the semiconductor chips 31 and 32. Generally, because the number of the bonding portions between the wires 51 and 52 and the semiconductor chips 31 and 32 is high, all of the bonding portions between the wires 51 and 52 and the semiconductor chips 31 and 32 can be covered reliably and efficiently by forming the first resin member 41 to cover all of the semiconductor chips 31 and 32.

First, the first resin member 41 is formed; subsequently, the second resin member 42 is formed. For example, when a sintered material including silver is used as the bonding agent 33, the first resin member 41 is formed to cover the bonding agent 33 as well; thereby, the scattering of the silver as dust in the processes after forming the first resin member 41 until the second resin member 42 is formed can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. A semiconductor device, comprising:
a metal plate;
a sidewall member surrounding a periphery of a space above the metal plate;

a first circuit board provided on the metal plate, the first circuit board including a first insulating substrate and a first interconnect part;

a second circuit board provided on the metal plate, the second circuit board including a second insulating substrate, a second interconnect part, and a third interconnect part;

a first semiconductor chip provided on the first circuit board;

a second semiconductor chip provided on the second circuit board;

a first wire connecting the first semiconductor chip and the second interconnect part of the second circuit board;

a second wire connecting the second semiconductor chip and the third interconnect part of the second circuit board;

a first resin member covering a bonding portion between the first semiconductor chip and the first wire;

a second resin member covering a bonding portion between the second semiconductor chip and the second wire; and a third resin member provided in the space, the third resin member covering an upper surface of the metal plate, the first and second circuit boards, the first and second resin members, and the first and second wires, a Young's modulus of the first resin member and a Young's modulus of the second resin member being greater than a Young's modulus of the third resin member, a volume of the third resin member being greater than a volume of the first resin member and a volume of the second resin member.

2. The device according to claim 1, wherein
the first resin member and the second resin member include mainly an epoxy resin, a phenol resin, or an acrylic resin, and
the third resin member includes mainly a silicone resin or a urethane resin.

3. The device according to claim 1, wherein
the first insulating substrate and the second insulating substrate are ceramic substrates.

4. The device according to claim 1, wherein
the first resin member entirely covers the first semiconductor chip, and
the second resin member entirely covers the second semiconductor chip.

5. The device according to claim 1, wherein
a bonding portion between the first wire and the second interconnect part of the second circuit board is covered with the third resin member but not covered with the first resin member, and
a bonding portion between the second wire and the third interconnect part of the second circuit board is covered with the third resin member but not covered with the second resin member.

6. The device according to claim 1, wherein
a lower surface of the metal plate is exposed.

7. The device according to claim 1, wherein
the sidewall member is a resin member.

8. The device according to claim 1, wherein
the first and second semiconductor chips include power elements for power control.

9. The device according to claim 1, wherein
the first and second semiconductor chips include electrodes of aluminum provided at upper surfaces of the first and second semiconductor chips,
one end portion of the first wire is bonded to the electrode of the first semiconductor chip, and
one end portion of the second wire is bonded to the electrode of the second semiconductor chip.

10. The device according to claim 1, further comprising:
a conductor part provided at an upper surface and an inner wall portion of the sidewall member; and
a third wire connecting the conductor part and the first interconnect part.

11. The device according to claim 10, wherein
a bonding portion between the third wire and the conductor part and a bonding portion between the third wire and the first interconnect part are covered with the third resin member but not covered with the first resin member.

12. The device according to claim 1, wherein
the first wire is an aluminum wire.

13. The device according to claim 10, wherein
the second wire is an aluminum wire.

14. The device according to claim 1, wherein
a lower surface of the first semiconductor chip is bonded to the first interconnect part, and
the first resin member covers a bonding portion between the first interconnect part and the lower surface of the first semiconductor chip.

15. The device according to claim 14, wherein
the lower surface of the first semiconductor chip is bonded to the first interconnect part by solder.

16. The device according to claim 14, wherein
the lower surface of the first semiconductor chip is bonded to the first interconnect part by a sintered material including silver.

17. The device according to claim 1, wherein
a part of the first interconnect part, a part of the second interconnect part, and the third interconnect part are covered with the second resin member.

18. The device according to claim 1, wherein
the first circuit board is apart from the second circuit board.

19. The device according to claim 1, wherein
the first resin member is apart from the third resin member.

* * * * *